United States Patent
Li

(10) Patent No.: US 8,228,073 B2
(45) Date of Patent: Jul. 24, 2012

(54) SIGNAL MONITORING SYSTEMS

(75) Inventor: Guoxing Li, Sunnyvale, CA (US)

(73) Assignee: O2Micro Inc, Santa Clara, CA (US)

(*) Notice: Subject to any disclaimer, the term of this patent is extended or adjusted under 35 U.S.C. 154(b) by 44 days.

(21) Appl. No.: 12/976,509

(22) Filed: Dec. 22, 2010

(65) Prior Publication Data

US 2012/0007652 A1    Jan. 12, 2012

Related U.S. Application Data

(60) Provisional application No. 61/393,244, filed on Oct. 14, 2010.

(51) Int. Cl.
*G01R 35/00* (2006.01)
*G01R 13/02* (2006.01)
*G01N 27/416* (2006.01)

(52) U.S. Cl. ............ 324/601; 324/426; 324/76.55
(58) Field of Classification Search ............ 324/601, 324/426, 76.55
See application file for complete search history.

(56) References Cited

U.S. PATENT DOCUMENTS

| 6,236,215 B1* | 5/2001 | Kanehira ............ 324/429 |
| 2008/0069176 A1* | 3/2008 | Pertijs et al. ............ 374/1 |

* cited by examiner

*Primary Examiner* — Amy He

(57) ABSTRACT

A signal monitoring system includes a conversion circuit and a controller coupled to the conversion circuit. The conversion circuit converts a reference input to a reference output based on a real-time level of a trim reference and converts a monitored signal to an output signal. The controller calibrates the output signal according to the reference output and according to a predefined reference. The predefined reference is determined by the reference input and by a pre-trimmed level of the trim reference.

20 Claims, 8 Drawing Sheets

SIGNAL MONITORING SYSTEMS

RELATED APPLICATION

This application claims priority to U.S. Provisional Application No. 61/393,244, filed on Oct. 14, 2010, which is hereby incorporated by reference in its entirety.

BACKGROUND

A conventional analog-to-digital converter (ADC) usually converts an analog input signal $V_{IN}$ to a digital output signal $D_{OUT}$ based on a bandgap reference voltage $V_{REF}$. The digital output signal $D_{OUT}$ indicates a ratio of the analog input signal $V_{IN}$ to the bandgap reference voltage $V_{REF}$. The bandgap reference voltage $V_{REF}$ can be generated by a bandgap reference circuit with first-order, second-order, or higher-order temperature compensation. Disadvantageously, if the bandgap reference voltage $V_{REF}$ is generated by a bandgap reference circuit with low-order temperature compensation, the bandgap reference voltage $V_{REF}$ may vary over a predefined temperature range. For example, a bandgap reference voltage $V_{REF}$ generated by a bandgap reference circuit with first-order temperature compensation varies by a few millivolts over the range of −55° C. to 125° C. Such variation can cause an output error to the ADC. If the bandgap reference voltage $V_{REF}$ is generated by a bandgap reference circuit with high-order temperature compensation, the bandgap reference voltage $V_{REF}$ may be substantially constant over the predefined temperature range. However, the structure of a bandgap reference circuit with high-order temperature compensation is complicated. If the bandgap reference circuit is integrated with the ADC into a single chip, design and testing of the bandgap reference circuit are sensitive to the process or change in the process performed by the ADC, which will increase the cost of automatic test equipment (ATE) and increase the time for testing performed by the ATE.

SUMMARY

In one embodiment, a signal monitoring system includes a conversion circuit and a controller coupled to the conversion circuit. The conversion circuit converts a reference input to a reference output based on a real-time level of a trim reference and converts a monitored signal to an output signal. The controller calibrates the output signal according to the reference output and according to a predefined reference. The predefined reference is determined by the reference input and by a pre-trimmed level of the trim reference.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

In one embodiment, the present invention provides a signal monitoring system. The signal monitoring system includes a conversion circuit to convert an input signal to an output signal based on a bandgap reference voltage. The signal monitoring system further includes a controller to perform real-time calibration on the output signal of the conversion circuit. By way of example, the controller calibrates the output signal of the conversion circuit in a real-time manner regardless of the present temperature. Thus, advantageously, the bandgap reference voltage can be generated by a bandgap reference circuit with low-order, e.g., first-order, temperature compensation. As such, the cost for automatic test equipment (ATE) is reduced. The time for testing/trimming process is also reduced. In addition, the design for the signal monitoring system is simplified.

Figure 1:
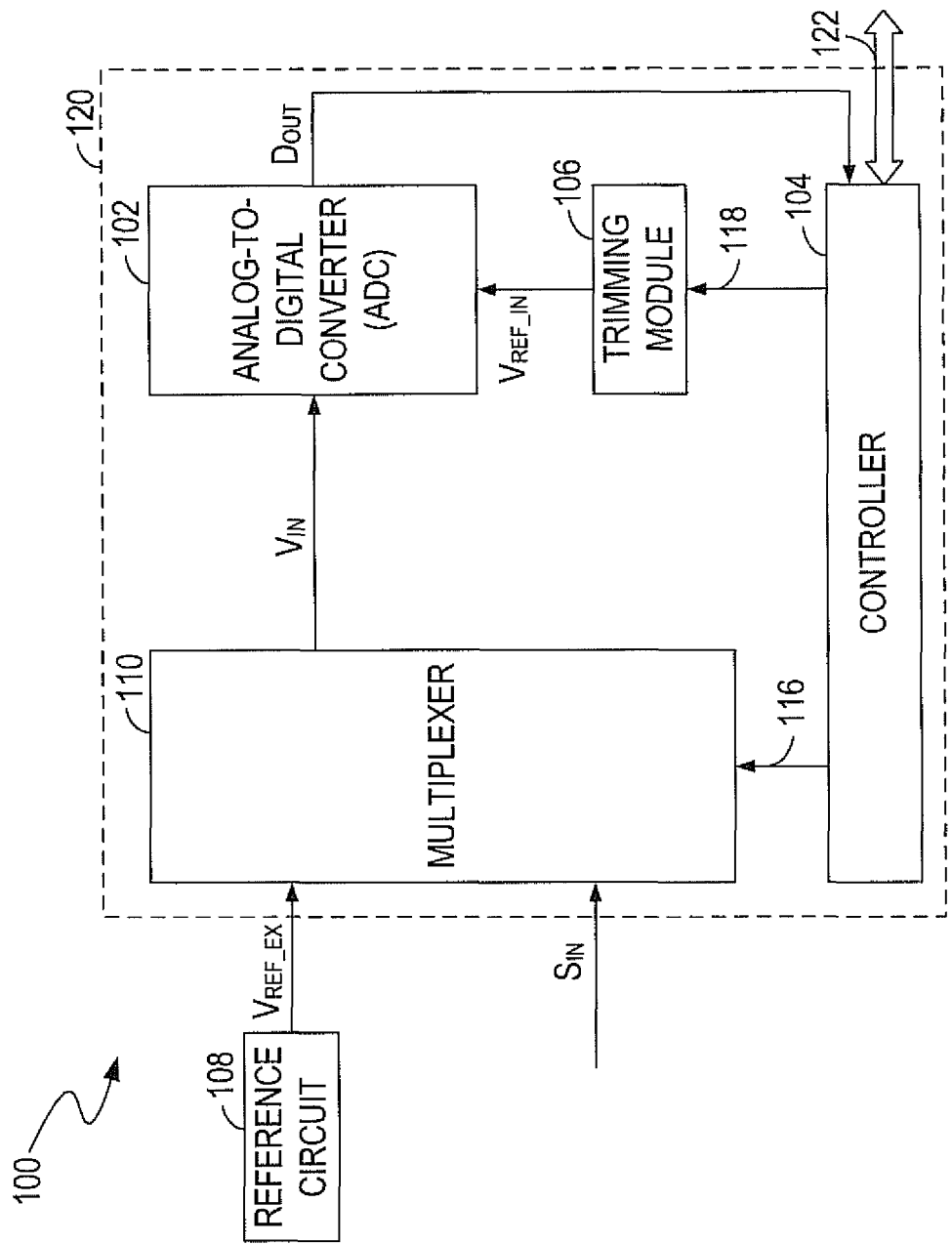
FIG. 1 illustrates a block diagram of an example of a signal monitoring system, in accordance with one embodiment of the present invention.

FIG. 1 illustrates a block diagram of an example of a signal monitoring system 100, in accordance with one embodiment of the present invention. As shown in FIG. 1, the signal monitoring system 100 includes a reference circuit 108 and monitoring circuitry 120. The monitoring circuitry 120 includes a multiplexer 110, a controller 104, a trimming module 106, and a conversion circuit, e.g., an ADC 102.

In one embodiment, the reference circuit 108 provides a preset reference input (or an external reference) $V_{REF\_EX}$ to the multiplexer 110. The multiplexer 110 selects an input signal $V_{IN}$ from the preset reference input $V_{REF\_EX}$ and a monitored signal $S_{IN}$ and provides the input signal $V_{IN}$ to the ADC 102 via a first terminal. The ADC 102 converts the analog input signal $V_{IN}$ to a digital output signal $D_{OUT}$ based on a trim reference (or an internal reference) $V_{REF\_IN}$ from the trimming module 106. By way of example, the output signal $D_{OUT}$ is given by:

$$D_{OUT}=int(V_{IN}*2^K/V_{REF\_IN}), \qquad (1)$$

where K represents the resolution of the ADC 102. The ADC 102 provides the digital output signal $D_{OUT}$ to the controller 104 via a second terminal. The controller 104 generates a select signal 116 to select the input signal $V_{IN}$ from the input signals of the multiplexer 110 to be transferred to the ADC 102. The controller 104 also generates a trimming code 118, e.g., a binary code or a hexadecimal code, to the trimming module 106 to adjust the trim reference $V_{REF\_IN}$.

In one embodiment, the preset reference input $V_{REF\_EX}$ is substantially constant over a predefined temperature range, e.g., from −55° C. to 125° C. By way of example, the preset reference input $V_{REF\_EX}$ is generated by a stand-alone bandgap reference circuit 108 with high-order temperature compensation. The stand-alone bandgap reference circuit 108 can be separated from the monitoring circuitry 120 to decrease design cost and test cost for the signal monitoring system 100. The trim reference $V_{REF\_IN}$ may vary over the predetermined temperature range. By way of example, the trimming module 106 includes a bandgap reference circuit with first-order temperature compensation to generate the trim reference $V_{REF\_IN}$. In addition, the multiplexer 110 may include resistor mismatch caused by the variation of the temperature. Advantageously, the controller 104 can calibrate the output signal $D_{OUT}$ in a real-time manner based on the preset reference input $V_{REF\_EX}$, such that the output signal $D_{OUT}$ indicates the monitored signal $S_{IN}$ accurately despite the variation of the trim reference $V_{REF\_IN}$ and the resistor mismatch. Furthermore, the signal monitoring system 100 can perform self-diagnosis for the ADC 102, in one embodiment.

The controller 104 can calibrate the output signal $D_{OUT}$ based on the preset reference input $V_{REF\_EX}$ by various solutions. As an example, the ADC 102 converts the preset reference input $V_{REF\_EX}$ to a reference output $DA_{REF}$ based on a real-time level of the trim reference $V_{REF\_IN}$. The reference output $DA_{REF}$ is a real-time digital signal indicative of the preset reference input $V_{REF\_EX}$. The ADC 102 also converts the monitored signal $S_{IN}$ to an output signal $D_{OUT}$ based on the real-time level of the trim reference $V_{REF\_IN}$. The output signal $D_{OUT}$ is a real-time digital signal indicative of the monitored signal $S_{IN}$. The controller 104 sets a correcting factor CF according to a ratio of the reference output $DA_{REF}$ to a predefined reference $D_{REF}$, and calculates a calibrated signal $D'_{OUT}$ of the output signal $D_{OUT}$ according to the error factor CF and the real-time level of the trim reference $V_{REF\_IN}$. The predefined reference $D_{REF}$ is determined by the preset reference input $V_{REF\_EX}$ and a pre-trimmed level $V'_{REF\_IN}$ (or an ideal level) of the trim reference $V_{REF\_IN}$. The predefined reference $D_{REF}$ can be calculated based on a relation of the monitored signal $S_{IN}$, the output signal $D_{OUT}$ and the trim reference $V_{REF\_IN}$. For example, according to equation (1), the predefined reference $D_{REF}$ is given by:

$$D_{REF}=int(V_{REF\_EX}*2^K/V'_{REF\_IN}). \quad (2)$$

In one embodiment, the trim reference $V_{REF\_IN}$ is pre-trimmed to a predefined level $V'_{REF\_IN}$ at a room temperature such as 25° C. In one embodiment, the controller 104 calculates the correcting factor CF according to the following equation:

$$CF=DA_{REF}/D_{REF}. \quad (3)$$

As a result, the calibrated signal $D'_{OUT}$ indicative of the monitored signal $S_{IN}$ is obtained according to the following equation:

$$D'_{OUT}=D_{OUT}/CF. \quad (4)$$

In one embodiment, the controller 104, e.g., a microcontroller (μC), performs the calculation for the correcting factor CF and the calibrated signal $D'_{OUT}$. However, the invention is not so limited. In another embodiment, the controller 104 provides data from the ADC 102 to an external microprocessor (μP) (not shown in FIG. 1), e.g., a central processing unit (CPU) or a microprocessor control unit (MCU), via a bus interface 122, such that the external μP performs the calculation for the correcting factor CF and the calibrated signal $D'_{OUT}$. In one embodiment, the external μP controls the signal monitoring system 100 via the controller 104.

As another example, the ADC 102 converts the preset reference input $V_{REF\_EX}$ to a reference output $DA_{REF}$ based on a present level (or a real-time level) of the trim reference $V_{REF\_IN}$. The controller 104 adjusts the trim reference $V_{REF\_IN}$ from the present level to a calibrated level according to the difference between the reference output $DA_{REF}$ and the predefined reference $D_{REF}$. More specifically, if the reference output $DA_{REF}$ is greater than the predefined reference $D_{REF}$, the controller 104 increases the trimming code 118 to increase the trim reference $V_{REF\_IN}$. Thus, according to equation (1), the reference output $DA_{REF}$ decreases. If the reference output $DA_{REF}$ is less than the predefined reference $D_{REF}$, the controller 104 decreases the trimming code 118 to decrease the trim reference $V_{REF\_IN}$. Thus, the reference output $DA_{REF}$ increases. In other words, the controller 104 controls the reference output $DA_{REF}$ toward the predefined reference $D_{REF}$ by adjusting the trim reference $V_{REF\_IN}$. When a difference between the reference output $DA_{REF}$ and the predefined reference $D_{REF}$ is less than a predetermined threshold $E_T$, the trim reference $V_{REF\_IN}$ is adjusted to the calibrated level. The ADC 102 converts the monitored signal $S_{IN}$ to an output signal $D_{OUT}$ based on the calibrated level of the trim reference $V_{REF\_IN}$. As a result, the output signal $D_{OUT}$ is calibrated to indicate the monitored signal $S_{IN}$ more accurately.

Although the signal monitoring system 100 is described in relation to analog-to-digital conversion, the invention is also suitable for digital-to-analog conversion. The output of the digital-to-analog conversion can be calibrated in a similar manner.

Figure 2:
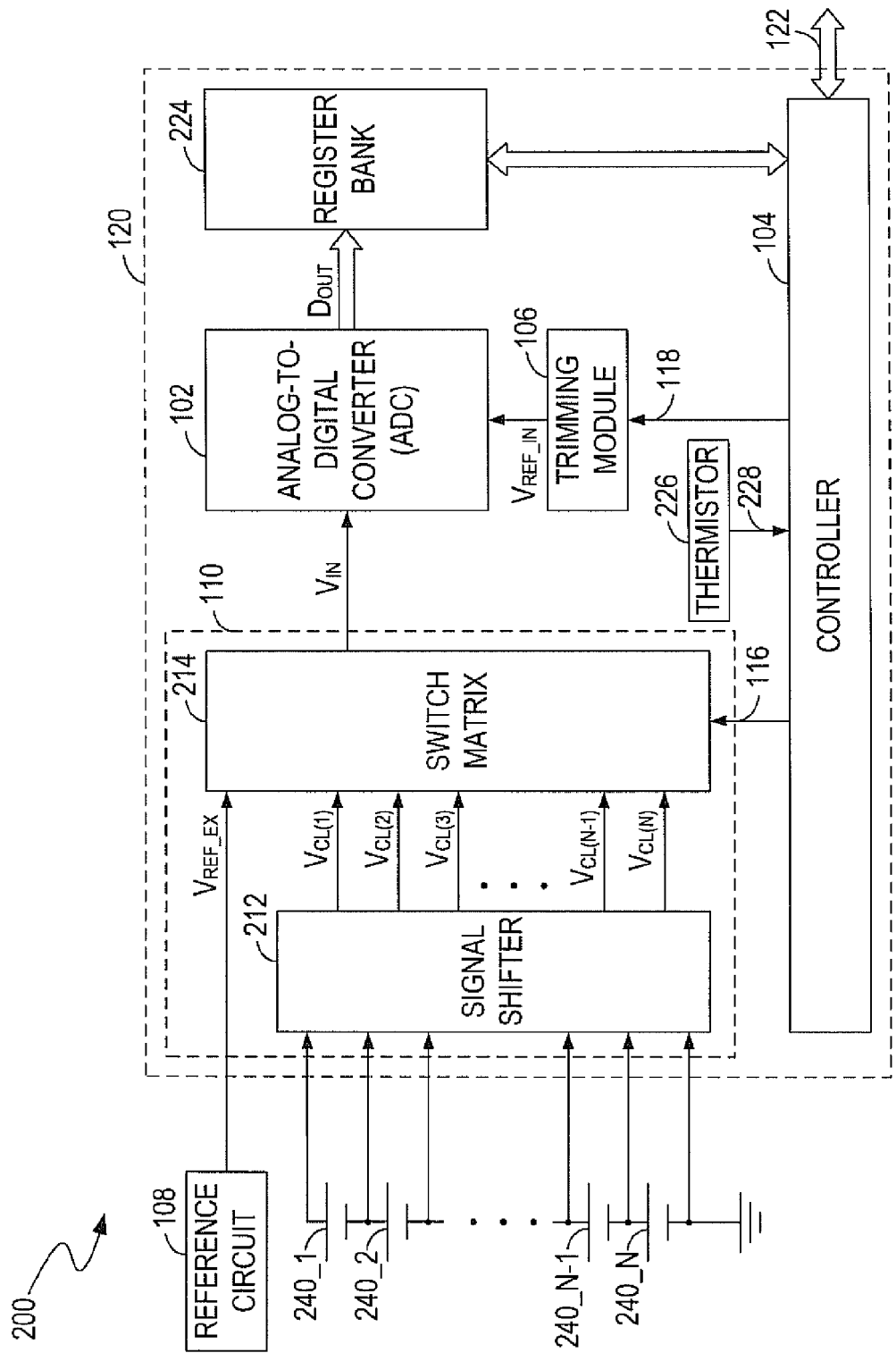
FIG. 2 illustrates a block diagram of an example of a battery monitoring system, in accordance with one embodiment of the present invention.

FIG. 2 illustrates a block diagram of an example of a battery monitoring system 200, in accordance with one embodiment of the present invention. The battery monitoring system 200 includes monitoring circuitry 120, a reference circuit 108, and a set of cells 240_1, 240_2, . . . , 240_N, e.g., Lithium-Ion battery cells or lead-acid battery cells. The monitoring circuitry 120 cooperating with the reference circuit 108 monitors a status, e.g., each cell voltage, a charging or discharging current, etc., of the cells 240_1-240_N.

As shown in FIG. 2, the monitoring circuitry 120 includes a multiplexer 110, an ADC 102, a controller 104, a trimming module 106, and a register bank 224. A thermistor 226 can be arranged inside or outside of the monitoring circuitry 120. The multiplexer 110 includes a signal shifter 212 and a switch matrix 214. In one embodiment, the signal shifter 212 receives terminal voltages of the cells 240_1-240_N and generates cell voltages $V_{CL(1)}, V_{CL(2)}, \ldots V_{CL(N)}$ of the cells 240_1-240_N to the switch matrix 214. The reference circuit 108 also provides a preset reference input $V_{REF\_EX}$ to the switch matrix 214. The switch matrix 214 includes multiple switches (not shown in FIG. 2) controlled by the select signal 116 from the controller 104. The select signal 116 can turn on one or more switches in the switch matrix 214 such that a corresponding cell voltage $V_{CL(1)}, V_{CL(2)}, \ldots V_{CL(N)}$ or the preset reference input $V_{REF\_EX}$ is transferred to the ADC 102. The ADC 102 converts the input signal $V_{IN}$ selected from the cell voltages $V_{CL(1)}, V_{CL(2)}, \ldots V_{CL(N)}$ and the preset reference input $V_{REF\_EX}$ to an output signal $D_{OUT}$ based on a trim reference $V_{REF\_IN}$ from the trimming module 106. The register bank 224, e.g., a non-volatile memory, stores the output signal $D_{OUT}$ from the ADC 102. The register bank 224 also stores a predefined reference $D_{REF}$ provided by the controller 104. The controller 104 calculates the predefined reference $D_{REF}$ according to equation (2). The controller 104 also generates a trimming code 118 to the trimming module 106 to adjust the trim reference $V_{REF\_IN}$. The thermistor 226 senses a temperature $T_P$ of the monitoring circuitry 120 and sends a temperature sense signal 228 to the controller 104 for calibration process.

Figure 3:
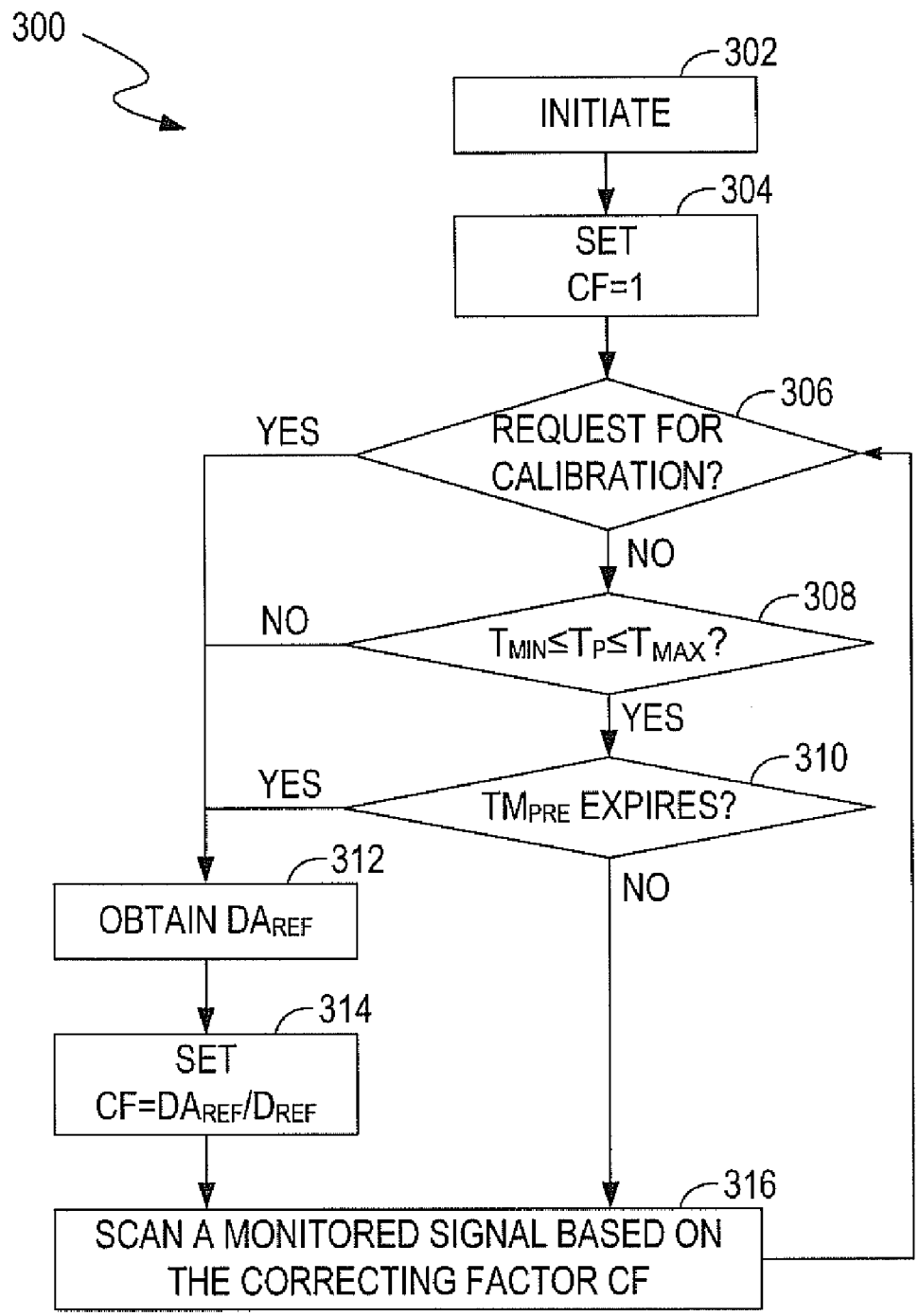
FIG. 3 illustrates a flowchart of an example of a method for calibrating an output of a signal monitoring system, in accordance with one embodiment of the present invention.

FIG. 3 illustrates a flowchart 300 of an example of a method for calibrating an output of a signal monitoring system, in accordance with one embodiment of the present invention. Although specific steps are disclosed in FIG. 3, such steps are examples for illustrative purposes. That is, the present invention is well suited to performing various other steps or variations of the steps recited in FIG. 3. FIG. 3 is described in combination with FIG. 1 and FIG. 2.

At step 302, the signal monitoring system 100 is initiated. At step 304, the controller 104 sets a correcting factor CF to one, e.g., CF=1. At step 306, the signal monitoring system 100 detects whether a request for calibration is issued. In one embodiment, the controller 104 can receive a request for calibration issued by an external μP via the bus interface 122. The controller 104 can also issue a request for calibration by itself. If a request for calibration is issued, the signal monitoring system 100 performs step 312 to start the calibration process; otherwise, it performs step 308.

At step 308, the controller 104 receives a temperature sense signal 228 from the thermistor 226 to determine whether a temperature $T_P$ of the signal monitoring system 100 is within a predetermined range from a minimum temperature $T_{MIN}$ to a maximum temperature $T_{MAX}$. If the temperature $T_P$ is beyond the predetermined range, e.g., $T_P<T_{MIN}$ or $T_P>T_{MAX}$, the signal monitoring system 100 performs step 312; otherwise, it performs step 310.

At step 310, the controller 104 determines whether a predetermined time cycle $TM_{PRE}$ is expired. In one embodiment, the signal monitoring system 100 includes a timer (not shown in FIG. 1 and FIG. 2) to count time, and generates an interrupt signal periodically with the predetermined time cycle $TM_{PRE}$. If a predetermined time cycle $TM_{PRE}$ is expired, the controller 104 receives an interrupt signal from the timer and performs step 312 to start calibration process. Otherwise, the signal monitoring system 100 performs step 316.

At step 316, the signal monitoring system 100 scans a monitored signal $S_{IN}$, e.g., one of the cell voltages $V_{CL(1)}$, $V_{CL(2)}, \ldots V_{CL(N)}$ of the cells 240_1-240_N in FIG. 2, based on the correcting factor CF. By way of example, the controller 104 selects the input signal $V_{IN}$ from the cell voltages $V_{CL(1)}$, $V_{CL(2)}, \ldots V_{CL(N)}$ to the ADC 102 sequentially. The ADC 102 converts the input signal $V_{IN}$ to an output signal $D_{OUT}$ according to equation (1) and stores the output signal $D_{OUT}$ to the register bank 224. The controller 104 reads the output signal $D_{OUT}$ from the register bank 224 and calculates a calibrated signal $D'_{OUT}$ indicative of the input signal $V_{IN}$ according to equation (4).

In one embodiment, if the signal monitoring system 100 does not detect a request for calibration, the temperature $T_P$ is within the predetermined range, e.g., $T_{MIN} \leq T_P \leq T_{MAX}$, and a predetermined time cycle $TM_{PRE}$ has not been expired yet, the correcting factor CF remains unchanged. However, if the signal monitoring system 100 detects a request for calibration, or the temperature $T_P$ is beyond the predetermined range, or a predetermined time cycle $TM_{PRE}$ is expired, then the controller 104 re-calculates the correcting factor CF.

At step 312, the controller 104 obtains a reference output $DA_{REF}$ from the register bank 224. More specifically, the controller 104 selects the preset reference input $V_{REF\_EX}$ to be transferred to the ADC 104. The ADC 104 converts the preset reference input $V_{REF\_EX}$ to a reference output $DA_{REF}$ and stores the reference output $DA_{REF}$ in the register bank 224. At step 314, the controller 104 reads the reference output $DA_{REF}$ and the predefined reference $D_{REF}$ from the register bank 224 and sets the correcting factor CF to be equal to the reference output $DA_{REF}$ divided by the predefined reference $D_{REF}$. Following step 314, the signal monitoring system 100 scans the monitored signal $S_{IN}$ based on the re-calculated correcting factor CF. As a result, a calibrated signal $D'_{OUT}$ indicative of the monitored signal $S_{IN}$ is obtained according to equation (4).

Figure 4A:
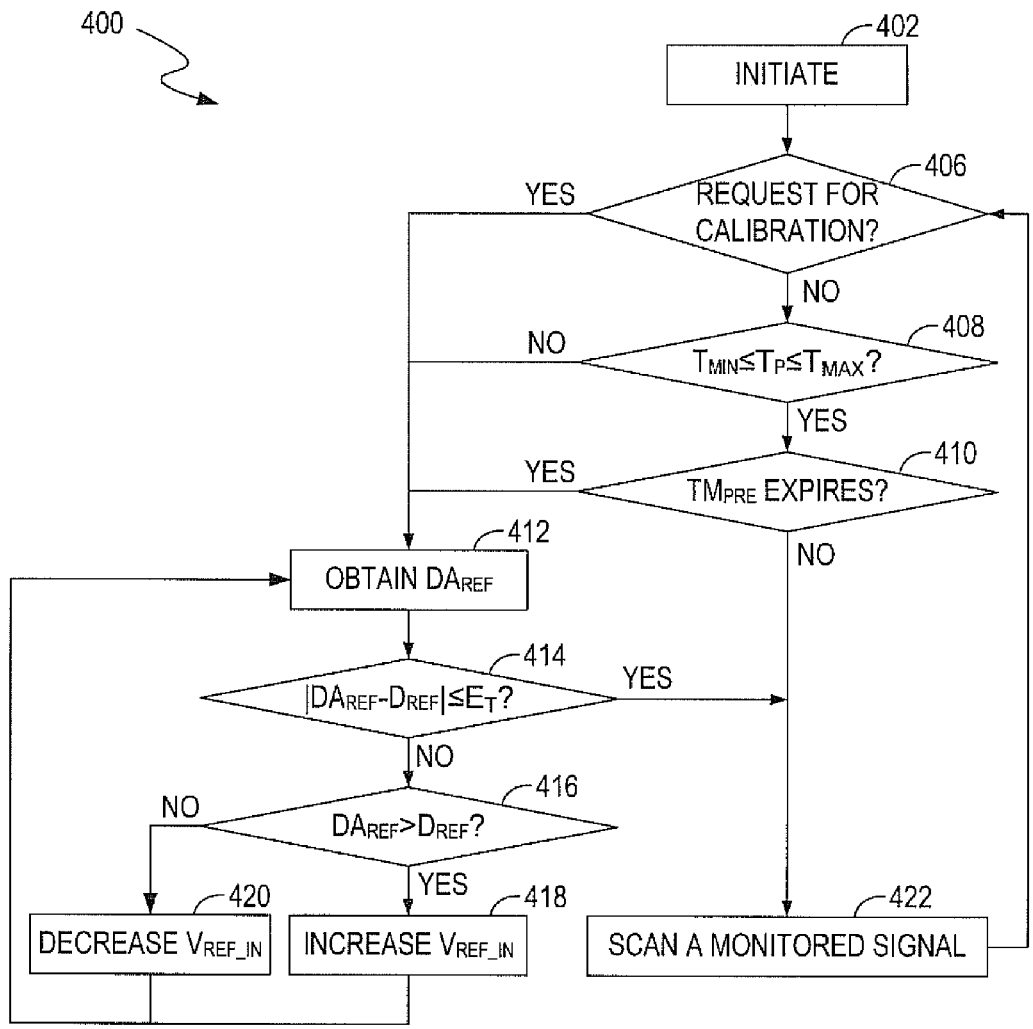
FIG. 4A illustrates a flowchart of an example of a method for calibrating an output of a signal monitoring system, in accordance with one embodiment of the present invention.

FIG. 4A illustrates a flowchart 400 of an example of a method for calibrating an output of a signal monitoring system, in accordance with one embodiment of the present invention. Although specific steps are disclosed in FIG. 4A, such steps are examples for illustrative purposes. That is, the present invention is well suited to performing various other steps or variations of the steps recited in FIG. 4A. FIG. 4A is described in combination with FIG. 1, FIG. 2 and FIG. 3. In one embodiment, steps 406, 408, 410 and 412 in FIG. 4A are similar to steps 306, 308, 310 and 312 in FIG. 3.

As shown in FIG. 4A, after the signal monitoring system 100 is initiated at step 402, the signal monitoring system 100 performs step 406 to detect whether a request for calibration is issued. The signal monitoring system 100 performs step 412 if a request for calibration is issued; otherwise, it performs step 408. At step 408, the signal monitoring system 100 determines whether a temperature $T_P$ of the signal monitoring system 100 is within a predetermined range from a minimum temperature $T_{MIN}$ to a maximum temperature $T_{MAX}$. The signal monitoring system 100 performs step 412 if the temperature $T_P$ is beyond the predetermined range; otherwise, it performs step 410. At step 410, the signal monitoring system 100 determines whether a predetermined time cycle $TM_{PRE}$ is expired. The signal monitoring system 100 performs step 412 if the predetermined time cycle $TM_{PRE}$ is expired; otherwise, it performs step 422.

At step 422, the signal monitoring system 100 scans a monitored signal $S_{IN}$, e.g., one of the cell voltages $V_{CL(1)}$, $V_{CL(2)}, \ldots V_{CL(N)}$, based on a trim reference $V_{REF\_IN}$ from the trimming module 106. In one embodiment, if the signal monitoring system 100 does not detect a request for calibration, the temperature $T_P$ is within the predetermined range, and a predetermined time cycle $TM_{PRE}$ has not been yet expired, then a present level of the trim reference $V_{REF\_IN}$ is considered to be within a desired range and the ADC 102 performs the conversion process based on the present level of the trim reference $V_{REF\_IN}$. However, if the signal monitoring system 100 detects a request for calibration, or the temperature $T_P$ is beyond the predetermined range, or a predetermined time cycle $TM_{PRE}$ is expired, then the controller 104 adjusts the trim reference $V_{REF\_IN}$ to a calibrated level.

At step 412, the controller 104 obtains a reference output $DA_{REF}$ from the register bank 224. At step 414, the controller 104 determines whether a difference between the reference output $DA_{REF}$ and the predefined reference $D_{REF}$ is less than a predetermined threshold $E_T$. If the difference between the reference output $DA_{REF}$ and the predefined reference $D_{REF}$ is less than or equal to the predetermined threshold $E_T$, the signal monitoring system 100 performs step 422; otherwise, it performs step 416.

At step 416, the controller 104 compares the reference output $DA_{REF}$ with the predefined reference $D_{REF}$. If the reference output $DA_{REF}$ is less than or equal to the predefined reference $D_{REF}$, the signal monitoring system 100 performs step 418 to increase the trim reference $V_{REF\_IN}$; otherwise, it performs step 420 to decrease the trim reference $V_{REF\_IN}$. More specifically, in one embodiment, the trimming code 118 from the controller 104 can adjust the trim reference $V_{REF\_IN}$ linearly. If the trimming code 118 increases by one, the trim reference $V_{REF\_IN}$ can increase by an increment $VR_{STEP}$. If the trimming code 118 increases by two, the trim reference $V_{REF\_IN}$ can increase by an increment $2*VR_{STEP}$. Similarly, if the trimming code 118 decreases by a quantity, the trim reference $V_{REF\_IN}$ can decrease by a decrement equal to the $VR_{STEP}$ multiplied by the quantity.

In one embodiment, at step 418 or 420, the controller 104 increases or decreases the trimming code 118 by a small quantity, e.g., one, two, etc., and then returns to step 412. In one such embodiment, the controller 104 performs steps 412, 414, 416, and step 418 or 420 repetitively until the difference between the reference output $DA_{REF}$ and the predefined reference $D_{REF}$ is less than or equal to the predetermined threshold $E_T$. When the difference between the reference output $DA_{REF}$ and the predefined reference $D_{REF}$ is less than or equal to the predetermined threshold $E_T$, the trim reference $V_{REF\_IN}$ is adjusted to a calibrated level $V_{CAL}$. The signal monitoring system 100 performs step 422 to scan the monitored signal $S_{IN}$ based on the calibrated level $V_{CAL}$ of the trim reference $V_{REF\_IN}$. As a result, the output signal $D_{OUT}$ indicates the monitored signal $S_{IN}$ more accurately.

Furthermore, in one embodiment, if the controller 104 performs steps 412, 414, 416, and step 418 or 420 repetitively for over a preset time, and the difference between the reference output $DA_{REF}$ and the predefined reference $D_{REF}$ is still greater than the predetermined threshold $E_T$, then an undesired condition occurs in the ADC 102. In such a situation, the ADC 102 can be disabled. In other words, the signal monitoring system 100 can perform self-diagnosis for the ADC 102.

Figure 4B:
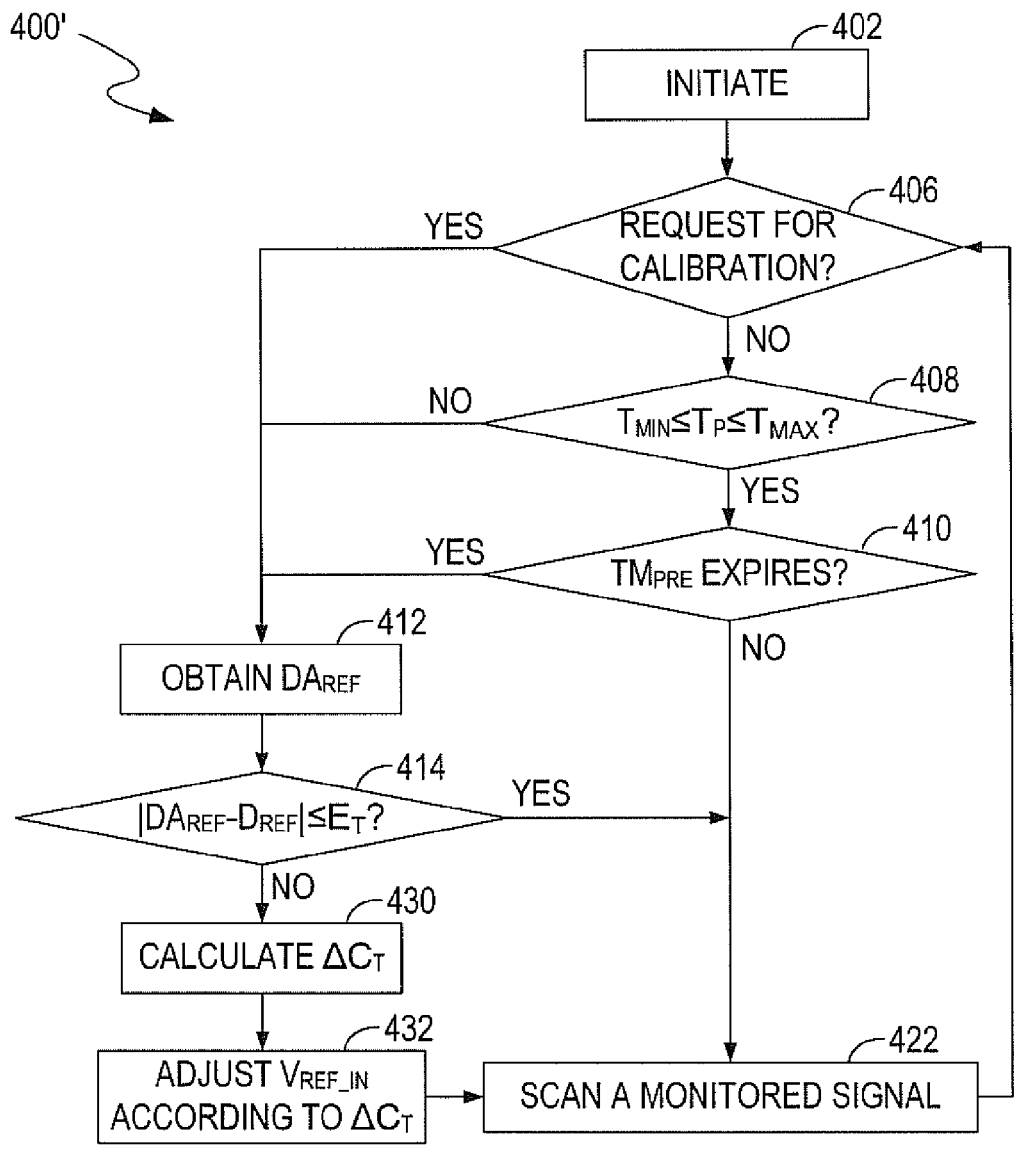
FIG. 4B illustrates a flowchart of an example of a method for calibrating an output of a signal monitoring system, in accordance with one embodiment of the present invention.

FIG. 4B illustrates a flowchart 400' of an example of a method for calibrating an output of a signal monitoring system, in accordance with one embodiment of the present invention. Steps that are labeled the same as in FIG. 4A are performed in a similar manner. FIG. 4B is described in combination with FIG. 1, FIG. 2 and FIG. 4A.

As shown in FIG. 4B, at step 414, if the difference between the reference output $DA_{REF}$ and the predefined reference $D_{REF}$ is greater than the predetermined threshold $E_T$, the signal monitoring system 100 performs step 430. At step 430, the controller 104 calculates a change $\Delta C_T$ for a value $C_T$ of the trimming code 118 according to the reference output $DA_{REF}$ and the predefined reference $D_{REF}$.

More specifically, a slope error $S_E$ can be given by:

$$S_E = (DA_{REF} - D_{REF})/D_{REF}. \quad (5)$$

In addition, a calibrated level $V_{CAL}$ of the trim reference $V_{REF\_IN}$ is given by:

$$V_{CAL} = V_{REF\_IN} * (1 + S_E). \quad (6)$$

In equation (6), $V_{REF\_IN}$ represents a present level of the trim reference $V_{REF\_IN}$ before the trim reference $V_{REF\_IN}$ is adjusted. Moreover, the calibrated level $V_{CAL}$ of the trim reference $V_{REF\_IN}$ can be given by:

$$V_{CAL} = V_{REF\_IN} + VR_{STEP} * \Delta C_T, \quad (7)$$

where $\Delta C_T$ represents a change in the trimming code 118. According to equations (5), (6) and (7), the following equation is obtained:

$$\Delta C_T = V_{REF\_IN} * (DA_{REF} - D_{REF})/(VR_{STEP} * D_{REF}). \quad (8)$$

Thus, the controller 104 calculates the change $\Delta C_T$ according to equation (8) at step 430.

At step 432, the controller 104 adjusts the trim reference $V_{REF\_IN}$ according to the change $\Delta C_T$. More specifically, the controller 104 can change the trimming code 118 from $C_T$ to $C_T + \Delta C_T$, thereby adjusting the trim reference $V_{REF\_IN}$ to the calibrated level $V_{CAL}$. As such, the reference output $DA_{REF}$ is adjusted to the predefined reference $D_{REF}$. Following step 432, the signal monitoring system 100 performs step 422 to scan the monitored signal $S_{IN}$ based on the calibrated level $V_{CAL}$ of the trim reference $V_{REF\_IN}$. As a result, the output signal $D_{OUT}$ indicates the monitored signal $S_{IN}$ more accurately.

Figure 5:
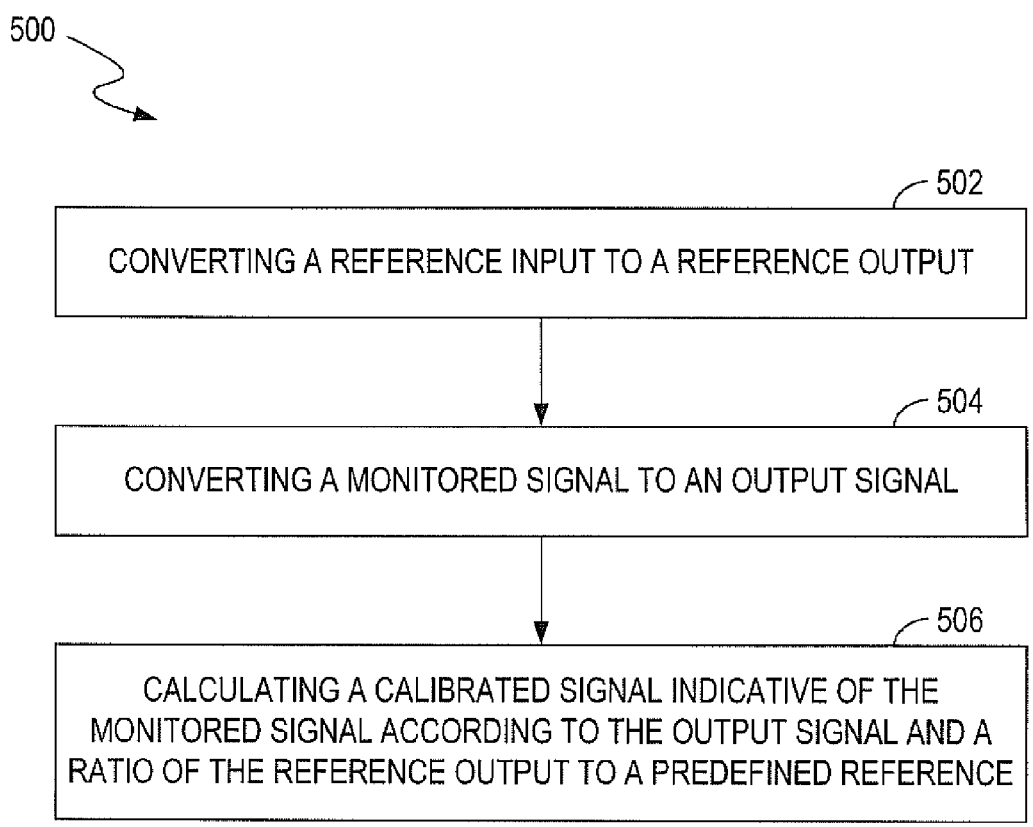
FIG. 5 illustrates a flowchart of examples of operations performed by a signal monitoring system, in accordance with one embodiment of the present invention.

FIG. 5 illustrates a flowchart 500 of examples of operations performed by a signal monitoring system, in accordance with one embodiment of the present invention. FIG. 5 is described in combination with FIG. 1, FIG. 2, and FIG. 3.

In block 502, the ADC 102 converts the preset reference input $V_{REF\_EX}$ to a reference output $DA_{REF}$. In block 504, the ADC 102 converts a monitored signal $S_{IN}$ to an output signal $D_{OUT}$. In block 506, the controller 104 calculates a calibrate signal $D'_{OUT}$ indicative of the monitored signal $S_{IN}$ according to the output signal $D_{OUT}$ and a correcting factor CF that is equal to a ratio of the reference output $DA_{REF}$ to a predefined reference $D_{REF}$.

Figure 6:
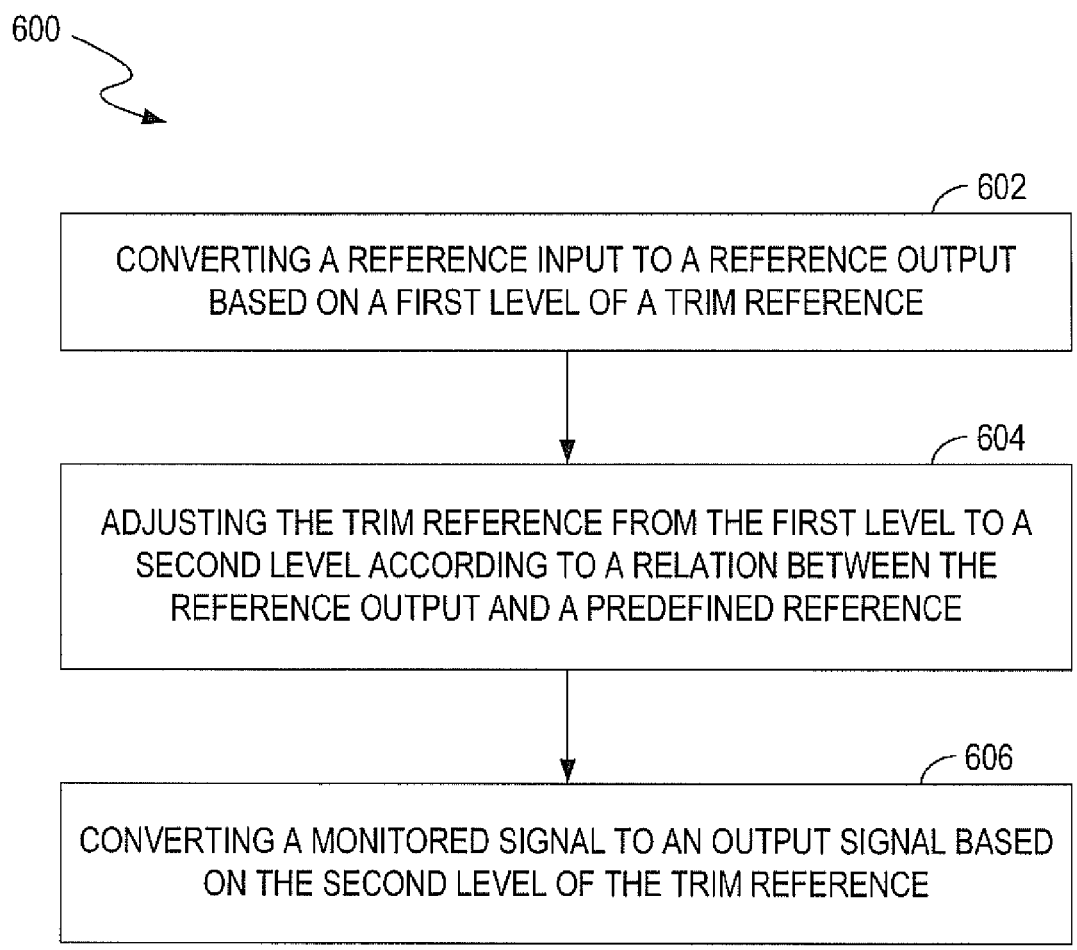
FIG. 6 illustrates a flowchart of examples of operations performed by a signal monitoring system, in accordance with one embodiment of the present invention.

FIG. 6 illustrates a flowchart 600 of examples of operations performed by a signal monitoring system, in accordance with one embodiment of the present invention. FIG. 6 is described in combination with FIG. 1, FIG. 2, FIG. 4A and FIG. 4B.

In block 602, the ADC 102 converts a preset reference input $V_{REF\_EX}$ to a reference output $DA_{REF}$ based on a present level of a trim reference $V_{REF\_IN}$. In block 604, the controller 104 adjusts the trim reference $V_{REF\_IN}$ from the present level to a calibrated level according to a relation between the reference output $DA_{REF}$ and a predefined reference $D_{REF}$. In block 606, the ADC 102 converts a monitored signal $S_{IN}$ to an output signal $D_{OUT}$ based on the calibrated level of the trim reference $V_{REF\_IN}$.

Figure 7:
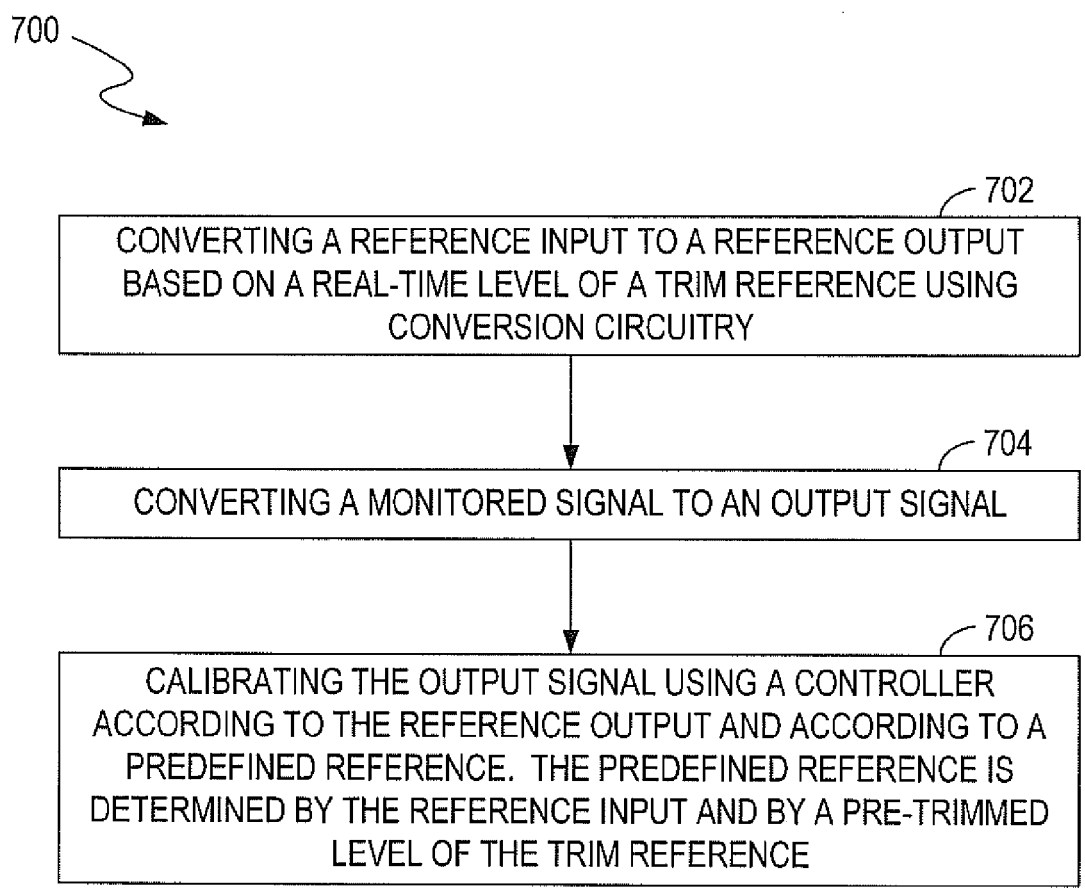
FIG. 7 illustrates a flowchart of examples of operations performed by a signal monitoring system, in accordance with one embodiment of the present invention.

FIG. 7 illustrates a flowchart 700 of examples of operations performed by a signal monitoring system, in accordance with one embodiment of the present invention. FIG. 7 is described in combination with FIG. 1, FIG. 2, FIG. 3, FIG. 4A and FIG. 4B.

In block 702, the conversion circuitry 102 converts a reference input $V_{REF\_EX}$ to a reference output $DA_{REF}$ based on a real-time level of a trim reference $V_{REF\_IN}$.

In block 704, the conversion circuitry 102 converts a monitored signal $S_{IN}$ to an output signal $D_{OUT}$.

In block 706, the controller 104 calibrates the output signal $D_{OUT}$ according to the reference output $DA_{REF}$ and according to a predefined reference $D_{REF}$. The predefined reference $D_{REF}$ is determined by the reference input $V_{REF\_EX}$ and by a pre-trimmed level $V'_{REF\_IN}$ of the trim reference $V_{REF\_IN}$.

In summary, embodiments according to the present invention provide signal monitoring systems operable for performing a calibration process in a real-time manner. In one embodiment, the signal monitoring system can monitor an input signal based on a bandgap reference circuit with low-order temperature compensation but can generate an output signal indicative of the input signal accurately. The signal monitoring system can be used in various applications. For example, it can be used in a battery monitoring system to monitor cell voltages of multiple cells and a charging/discharging current of the cells. It can also be used in medical equipment to monitor signals indicative of heartbeat information, sphygmus information, blood-pressure information, etc.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A signal monitoring system for a battery cell comprising:
   a conversion circuit operable for converting a reference input to a reference output based on a real-time level of a trim reference and converting a monitored signal to an output signal; and
   a controller coupled to said conversion circuit and operable for calibrating said output signal according to said reference output and also according to a predefined reference, wherein said predefined reference is determined by said reference input and by a pre-trimmed level of said trim reference.

2. The signal monitoring system as claimed in claim 1, wherein said conversion circuit comprises an analog-to-digital converter operable for converting an analog signal to a digital signal based on said trim reference.

3. The signal monitoring system as claimed in claim 2, wherein said digital signal is given by:

$$D_{OUT}=int(V_{IN}*2^K/V_{REF\_IN}),$$

where $D_{OUT}$ represents said digital signal, $V_{IN}$ represents said analog signal, $V_{REF\_IN}$ represents said trim reference, and K represents the resolution of said analog-to-digital converter.

4. The signal monitoring system as claimed in claim 1, wherein said predefined reference is calculated based on a relation of said monitored signal, said output signal, and said trim reference.

5. The signal monitoring system as claimed in claim 1, wherein said controller is operable for setting a correcting factor according to a ratio of said reference output to said predefined reference.

6. The signal monitoring system as claimed in claim 5, wherein said conversion circuit is operable for converting said monitored signal to said output signal based on said real-time level of said trim reference to provide a real-time level of said output signal, and wherein said controller is operable for calculating a calibrated level of said output signal according to said correcting factor and said real-time level of said output signal.

7. The signal monitoring system as claimed in claim 1, wherein said controller is operable for adjusting said trim reference to a calibrated level according to a difference between said reference output and said predefined reference.

8. The signal monitoring system as claimed in claim 7, wherein said conversion circuit is operable for converting said monitored signal to said output signal based on said calibrated level of said trim reference to provide a calibrated level of said output signal.

9. A method for monitoring a monitored signal of a battery cell, said method comprising:
   converting a reference input to a reference output based on a real-time level of a trim reference;
   converting said monitored signal to an output signal; and
   calibrating said output signal according to said reference output and a predefined reference, wherein said predefined reference is determined by said reference input and by a pre-trimmed level of said trim reference.

10. The method as claimed in claim 9, wherein said output signal is indicative of a ratio of said monitored signal to said trim reference.

11. The method as claimed in claim 9, wherein said predefined reference is calculated based on a relation of said monitored signal, said output signal, and said trim reference.

12. The method as claimed in claim 9, wherein said calibrating comprises:
   converting said monitored signal to said output signal based on said real-time level of said trim reference to provide a real-time level of said output signal; and
   calculating a calibrated level of said output signal according to said real-time level of said output signal and a ratio of said reference output to said predefined reference.

13. The method as claimed in claim 9, wherein said calibrating comprises:
   adjusting said trim reference to a calibrated level according to a difference between said reference output and said predefined reference; and
   converting said monitored signal to said output signal based on said calibrated level of said trim reference.

14. A signal monitoring system for a battery cell comprising:
   monitoring circuitry comprising a first terminal and a second terminal, wherein said first terminal is operable for receiving a reference input and operable for receiving a monitored signal, and wherein said second terminal is operable for providing a reference output based on said reference input and based on a real-time level of a trim reference, and operable for providing an output signal indicative of said monitored signal; and
   a controller coupled to said monitoring circuitry and operable for calibrating said output signal according to said reference output and according to a predefined reference, wherein said predefined reference is determined by said reference input and a pre-trimmed level of said trim reference.

15. The signal monitoring system as claimed in claim 14, wherein said output signal is indicative of a ratio of said monitored signal to said trim reference.

16. The signal monitoring system as claimed in claim 14, wherein said predefined reference is calculated based on a relation of said monitored signal, said output signal, and said trim reference.

17. The signal monitoring system as claimed in claim 14, wherein said controller is operable for setting a correcting factor according to a ratio of said reference output to said predefined reference.

18. The signal monitoring system as claimed in claim 17, wherein said controller is operable for obtaining a real-time level of said output signal by using said monitoring circuitry to generate said output signal based on said monitored signal and based on said real-time level of said trim reference, and operable for calculating a calibrated level of said output signal according to said correcting factor and said real-time level of said output signal.

19. The signal monitoring system as claimed in claim 14, wherein said controller is operable for adjusting said trim reference to a calibrated level according to a difference between said reference output and said predefined reference.

20. The signal monitoring system as claimed in claim 19, wherein said monitoring circuitry is operable for providing a calibrated level of said output signal by generating said output signal based on said calibrated level of said trim reference.

* * * * *